United States Patent
Johnson

(10) Patent No.: US 6,392,752 B1
(45) Date of Patent: May 21, 2002

(54) PHASE-MEASURING MICROLENS MICROSCOPY

(76) Inventor: Kenneth Carlisle Johnson, 2502 Robertson Rd., Santa Clara, CA (US) 95051

(*) Notice: Subject to any disclaimer, the term of this patent is extended or adjusted under 35 U.S.C. 154(b) by 128 days.

(21) Appl. No.: 09/591,723

(22) Filed: Jun. 12, 2000

Related U.S. Application Data

(60) Provisional application No. 60/139,002, filed on Jun. 14, 1999.

(51) Int. Cl.[7] .................................................. G01B 9/02
(52) U.S. Cl. ........................ 356/511; 356/516; 356/521
(58) Field of Search ................................. 356/511, 512, 356/516, 497, 521; 359/370

(56) References Cited

U.S. PATENT DOCUMENTS

| | | | |
|---|---|---|---|
| 5,737,084 A | * | 4/1998 | Ishihara ........................ 356/609 |
| 6,133,986 A | * | 10/2000 | Johnson ........................ 355/67 |

* cited by examiner

Primary Examiner—Samuel A. Turner

(57) ABSTRACT

A scanning microlens array functions in a manner analogous to an array of interference microscopes to provide phase-sensitive, confocal micro-imaging capability. Moreover, the scanning mechanism can effectively perform a phase-modulation function. In this mode of operation, each image point is scanned by multiple microlenses that have fixed, but differing, built-in phase offsets, and the combination of signals acquired from the multiple scans effectively simulate a phase-modulated interference signal.

7 Claims, 3 Drawing Sheets

PHASE-MEASURING MICROLENS MICROSCOPY

CROSS-REFERENCES TO RELATED APPLICATIONS

The following patent applications are hereby incorporated by reference in their entirety for all purposes:

"Microlens Scanner for Microlithography and Wide-Field Confocal Microscopy" (U.S. patent application Ser. No. 08/803,096, filed Feb. 20, 1997);

"Conformal Imaging Microlens Array" (Provisional Application 60/115,451, filed Jan. 11, 1999);

"Conformal Imaging Microlens Array with High Fill Factor" (Provisional Application 60/119,403, filed Feb. 1, 1999);

"Multi-Stage Microlens Array" (U.S. patent application Ser. No. 09/481,379 filed Jan. 11, 2000).

This application claims priority from the following provisional patent application, the disclosure of which is incorporated by reference:

"Phase-Measuring Microlens Array" (Provisional Application 60/139,002, filed Jun. 14, 1999).

BACKGROUND OF THE INVENTION

Optical microscopes that provide phase-measuring capability are useful for resolving small surface height variations on an inspection sample and for distinguishing sample materials based on their reflectance phase properties. Examples of phase-sensitive microscopes are Mirau interference microscopes, Nomarski differential phase contrast microscopes, and heterodyne interference microscopes. In each of these microscopes, an illumination beam is separated into two beams by some type of beam-splitting mechanism; at least one of the beams is focused onto and reflects off an inspection sample; and the two beams are then coherently recombined by the beam-splitting mechanism and projected onto an optical detector. The phase relationship between the recombined beams affects the detector-plane beam intensity; thus the detector signal is sensitive to small path length differences or sample-induced phase differences between the two beams. Some systems are also provided with a phase-modulating mechanism that applies a controlled phase shift to the beams, and the signal is sampled at multiple phase shifts to enhance measurement sensitivity.

The beam-splitting mechanism in a Mirau-type microscope is a partially-reflecting mirror between the microscope objective and the sample. In this system one of the separated beams is focused onto the sample and the other is focused onto a small reference mirror proximate to the objective. A limitation of the Mirau microscope is that the phase relationship between the recombined beams depends on the sample's focus height and is hence very sensitive to vibration and focus drift.

The Nomarski microscope focuses both beams onto the sample so that focus shifts affect both beams equally and therefore have no effect on their relative phase. In this type of system the beam-splitting element is typically a Wollaston prism which induces a slight angular separation between two polarization components of a transmitted beam, and the polarization-separated beams are focused by a microscope objective onto two proximate points on the sample. A Nomarski microscope is sensitive to differences in surface height or reflectance phase between the two focus points.

A heterodyne interference microscope is similar to a Nomarski microscope, except that the beam-splitting mechanism is typically an acousto-optic diffraction grating rather than a polarization-separation device. The grating functions to separate an incident beam into two diffracted beams. It also functions to introduce a precisely controlled frequency difference between the separated beams (which is equivalent to a time-variable induced phase shift). This greatly enhances the system's phase-measuring capability.

Surface height variations can also be accurately measured by means of confocal microscopy, in which a pinhole-filtered beam is focused onto a sample and the reflected beam is filtered through the same pinhole and projected onto a detector. Typically, the focused beam is raster-scanned across the sample to synthesize a two-dimensional image, and the sample's focus height may also be scanned to form a three-dimensional surface profile image. Confocal microscopes do not commonly provide phase-measuring capability—their depth discrimination is based on their narrow depth of focus. However, confocal microscopy can be used in conjunction with phase-measuring methods to provide enhanced depth discrimination. Several confocal systems of this type are described in "Confocal Microscopy", ed. T. Wilson, Academic Press, 1990.

Confocal systems that use a single scanning spot tend to be limited in their image acquisition speed. This limitation can be overcome by using multiple parallel-scanning spots (e.g., by using a Nipkow disk scanner) or a high-speed scanner (such as an acousto-optic scanner). However, a limitation of all of these methods is that their field size is limited by the microscope objective. A confocal system can only achieve high depth discrimination by using an objective of high numerical aperture, and such objectives generally have comparatively small field sizes.

High-resolution, high-speed confocal imaging over large image fields can be achieved by using a scanning microlens array. A system of this type is described in "Three-dimensional analysis by a microlens-array confocal arrangement", by Hans J. Tiziani and Hans-Martin Uhde, Applied Optics Vol. 33, No. 4 (1994), pp. 567–572; and a similar system is disclosed in U.S. pat. application Ser. No. 08/803,096. However, these systems do not provide phase-measuring capability.

SUMMARY OF THE INVENTION

A scanning confocal microlens array can be adapted to provide phase-measuring capability by equipping each microlens with a beam-splitting mechanism that separates the illumination on the microlens into two beams, at least one of which is focused onto and reflects off an inspection sample. The two beams are coherently recombined by the beam-splitting mechanism and are projected onto an element of a detector array, wherein each detector element senses radiation from a particular corresponding microlens. The sample is scanned laterally across the focal point array to build up a synthesized, two-dimensional image of the sample surface. The sample's focus height may also be scanned to form a three-dimensional surface profile image. (Either the lateral or focus scanning, or both, may eqivalently be effected by moving the microlens array relative to the sample.)

The microlens array could also be equipped with a phase-modulating mechanism to provide enhanced phase-measuring capability, in a manner analogous to a confocal heterodyne microscope. However, the same objective can be more simply achieved by effectively using the scanning motion itself as the phase-modulating mechanism. In this mode of operation, each beam-splitting mechanism applies a fixed, built-in phase shift to the two separated beams, but the phase shift is not the same for all microlenses. Each object point on the sample is scanned by several microlenses that have different built-in phse shifts, and the detector signals acquired from the different scans are combine provide confocal image data over a range of phase shifts.

DESCRIPTION OF THE SPECIFIC EMBODIMENTS

Figure 1:
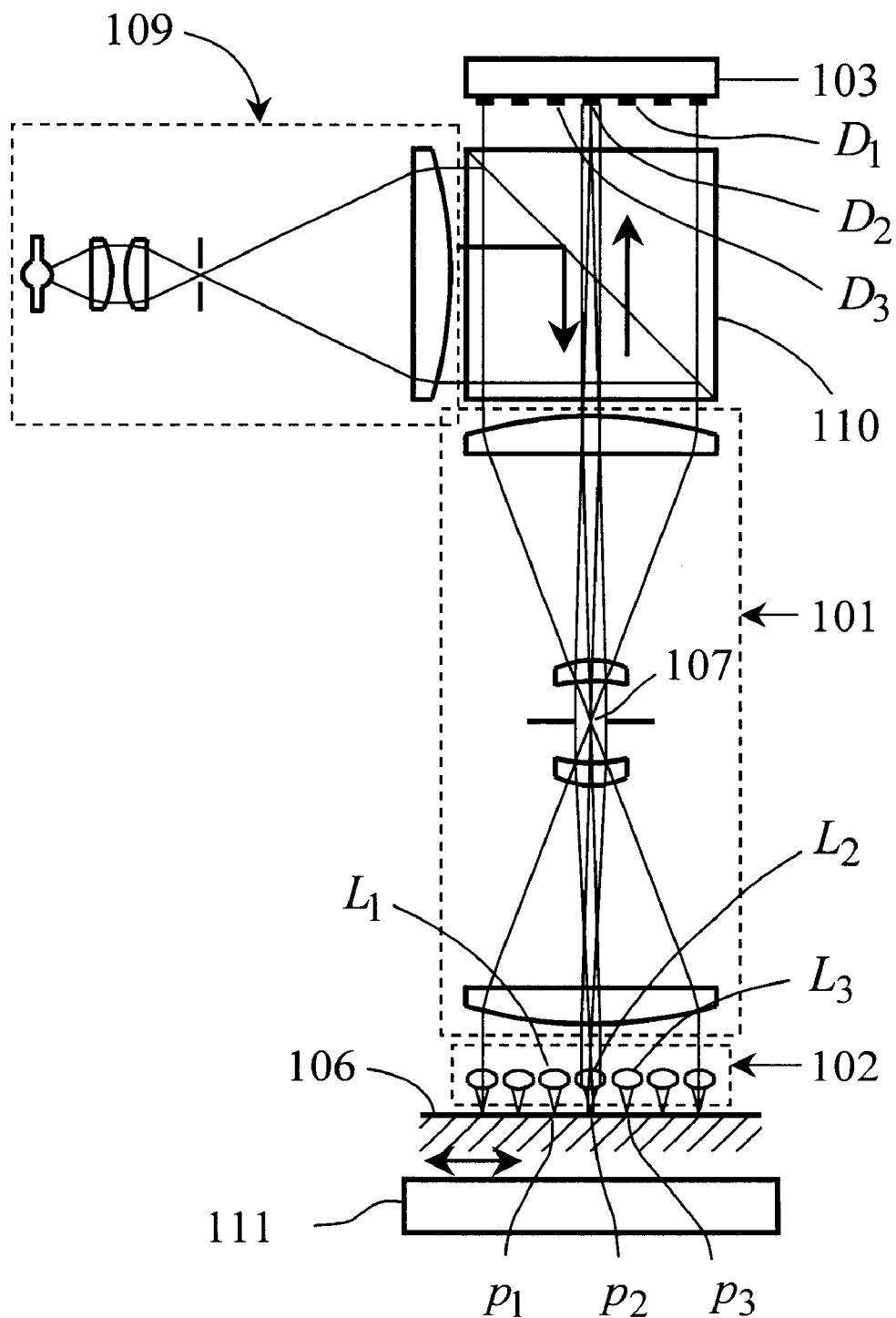
FIG. 1 schematically illustrates a confocal microlens microscopy system that can be adapted to provide phase-measuring capability.

FIG. 1 schematically illustrates a confocal microlens microscopy system that can be adapted to provide phase-measuring capability. (This is similar to FIG. 1 in U.S. pat. application Ser. No. 08/803,096. The system's phase-measuring features are not shown, but will be described below.) The system contains a low-resolution, double-telecentric optical projection system 101 which images a microlens array 102 onto an optical detector array 103. The microlens array comprises microlens elements, each of which is imaged onto a corresponding detector pixel element. For example, microlens elements $L_1$, $L_2$, $L_3$, etc. are imaged onto respective pixels $D_1$, $D_2$, $D_3$, etc. Each microlens collects radiation from a corresponding spot on or close to an inspection sample 106 (e.g., point $p_1$, $p_2$, or $p_3$, etc.) and focuses it onto an aperture stop 107 (the "projection aperture") in projection system 101. Thus the corresponding detector pixel senses the sample reflectivity over a very small spot on surface 106. For example, microlens $L_2$ focuses radiation from corresponding focal point $p_2$ onto the aperture 107, so pixel $D_2$ senses the reflectivity at $p_2$. The sample is illuminated in reflection mode from an illumination system 109, using a beam splitter 110 to merge the illumination into the light path. As the detector signal is acquired, a scanning mechanism 111 scans the sample 106 to build up a synthesized, high-resolution image.

The FIG. 1 schematic represents only one of a variety of optical configurations in which the phase measurement method can be applied. For example, FIG. 21b in U.S. pat. application Ser. No. 08/803,096 illustrates a microlens imaging system in which the projection system comprises reflective imaging optics and a reflective projection aperture, and the microlens array in this system could be configured to provide phase-measuring capability as described below.

Figure 2:
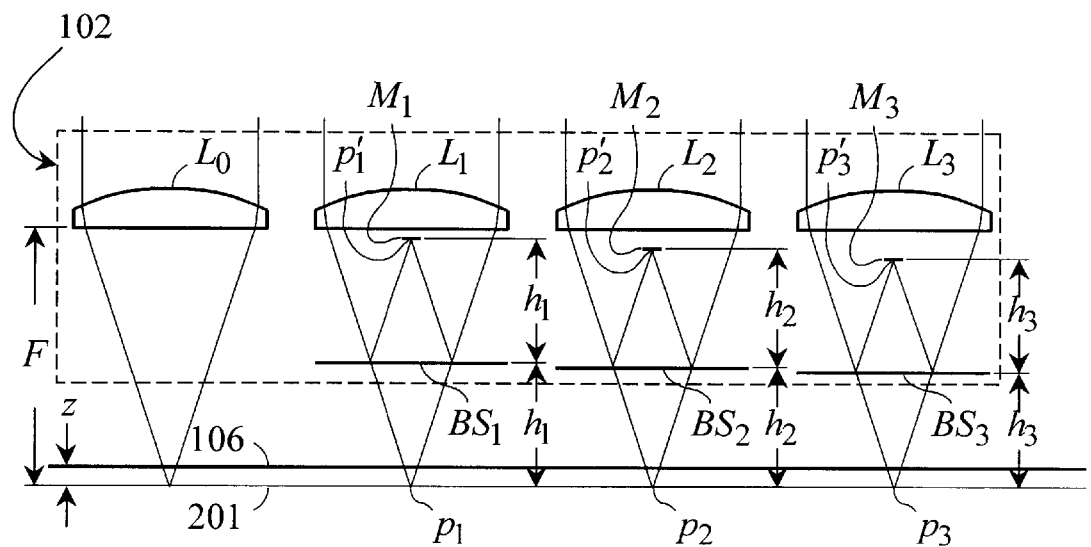
FIG. 2 illustrates an embodiment of a phase-measuring microles array in which each microlens operates as a miniature Mirau interference microscope.

FIG. 2 illustrates an embodiment of a phase-measuring microles array 102 in which each microlens operates as a miniature Mirau interference microscope. The array comprises microlenses $L_0$, $L_1$, $L_2$, $L_3$, etc. which are positioned proximate to inspection surface 106, and which preferably have a common focal length F and common focal plane 201. The surface height relative to the focal plane is denoted z. The microlenses are illustrated as continuous-profile lens elements in FIG. 1, but they could alternatively have other forms such as Fresnel lenses or binary optic diffractive lenses. At least some of the microlenses $L_j$ (j=1, 2, 3 . . . ) are provided with corresponding partially-reflecting beam-splitter films $BS_j$ and small reference mirrors $M_j$ proximate to the microlenses. The height of $BS_j$ above focal plane 201 is denoted $h_j$ and the height of $M_j$ above $BS_j$ is also preferably equal to $h_j$. Incident illumination is focused by each microlens $L_j$ and is separated into two beams by $BS_j$. The beam that transmits through $BS_j$ is focused to a point $p_j$ and is reflected by inspection surface 106; the beam reflected by $BS_j$ is focused to a point $p'_j$ on $M_j$ and is reflected by $M_j$; and the two beams are then recombined by $BS_j$ and pass back through $L_j$, and are detected by a corresponding detector pixel.

The beam splitter $BS_j$ or mirror $M_j$ could be vibrated or moved to modulate the phase relationship between the two combined beams, but a simpler, preferred method of achieving phase modulation is to scan the inspection surface under a row of microlenses which have fixed beam splitters and mirrors, but which have different height parameters $h_j$. The detector signals obtained from consecutive microlenses at a particular measurement point on the inspection surface can be combined to effectively synthesize signals that would be obtained from a single microlens with a varying $h_j$ parameter.

The microlenses may function as components of a confocal microscope such as that illustrated in FIG. 1. The system may contain some microlenses, such as element $L_0$, that do not have associated beam splitter and reference mirror elements. These elements would be used to detect focus height z. (By definition, the focus height on element $L_0$'s optical axis is zero at the focus position where the confocal intensity response from $L_0$ is maximum.)

The projection aperture 107 (FIG. 1) is conjugate to the microlens focal points $p_j$ and filters out stray light from sources such as multiple reflections between the beam splitters and the inspection surface. Assuming that such sources are adequately filtered out (either by the projection aperture or by other means), the measured return beam intensity $I_j[z]$ from lens $L_j$, at focus position z, will have the form $$I_j[z]=I^{(o)}(1+a[z]|r|^2+b[z]|r|\cos[\phi-\Phi_j[z]]) \qquad \text{Eq 1}$$

wherein j=1, 2, 3 . . . , r is the inspection surface's complex reflectance at point $p_j$, and $\phi$ is the phase of r, $$r=|r|\exp[i\phi] \qquad \text{Eq 2}$$

[Technically, the surface cannot be characterized by unique reflectance factor r because the reflectance is a function of incidence angle. Furthermore, in an out-of-focus condition focal point $p_j$ is not exactly at the surface and the beam may cover a non-negligible surface area. Nevertheless, the surface could be characterized in terms of a unique "effective reflectance coefficient" r that depends on the confocal optics configuration as well as the surface reflectance properties.] $\Phi_j[z]$ is a phase factor that depends on the focus position z and beam splitter height $h_j$; a[z] and b[z] are functions of z; and $I^{(o)}$ is the beam intensity that would be obtained with the inspection surface absent (i.e. with r=0). a[z], b[z], and $I^{(o)}$ are assumed to be the same for all microlenses. (This condition can be easily verified for $I^{(0)}$ by measuring $I_j[z]$ with the inspection surface absent.)

The terms $a[z]$, $b[z]$, and $\Phi_j[z]$ in Eq 1 are stable characteristics of the optical components, but the $I^{(0)}$ factor is proportional to the incident beam intensity and can therefore vary with time due to instability of the illumination source. Thus, in a typical measurement process Eq 1 contains three unknowns: $|r|$, $\phi$, and $I^{(0)}$, which can be determined from three intensity measurements $I_1[z]$, $I_2[z]$, and $I_3[z]$ obtained from three microlenses $L_1$, $L_2$, and $L_3$ having different beam splitter heights $h_1$, $h_2$, and $h_3$. The terms $a[z]$, $b[z]$, and $\Phi_j[z]$, which must be known in the measurement process, can be determined by a calibration procedure in which $I_1[z]$, $I_2[z]$, and $I_3[z]$ are measured on each of 4 calibration samples, one of whose complex reflectance r is known. The total number of measured quantities in the calibration process is 12, from which 12 unknowns can be determined. The unknowns are $I^{(0)}$, $a[z]$, $b[z]$, $\Phi_1[z]$, $\Phi_2[z]$, $\Phi_3[z]$, and the magnitude and phase of each of the three unknown reflectance factors. This procedure can be repeated at each of a range of focus positions z to calibrate the system over an extended focus range.

Figure 3:
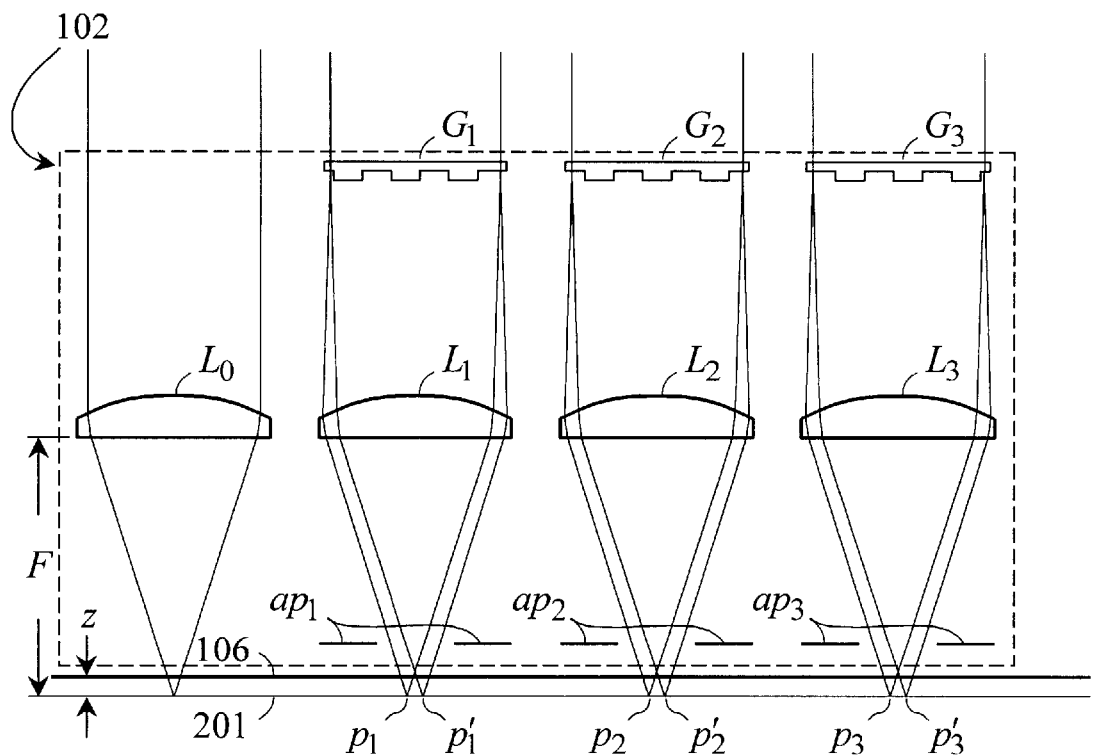
FIG. 3 illustrates an embodiment of a phase-measuring microles array in which each microlens operates in a manner analogous to a miniature Nomarski microscope.

Rather than using a reference mirror to measure the inspection surface's complex reflectance, the system can alternatively be designed to use a proximate point on the surface itself as a reflectance reference (in a manner analogous to Nomarski microscopy). This configuration is illustrated schematically in FIG. 3. The microlens array 102 comprises microlenses $L_0$, $L_1$, $L_2$, $L_3$, etc. which are positioned proximate to inspection surface 106, and which preferably have a common focal length F and common focal plane 201. The surface height relative to the focal plane is denoted z. At least some of the microlenses $L_j$ (j=1, 2, 3 . . . ) are provided with corresponding diffraction gratings $G_j$, each of which splits incident illumination into two diffracted orders that are focused by $L_j$ to proximate points $p_j$ and $p'_j$ on the focal plane. The reflected beams then pass back through $L_j$, are recombined by $G_j$, and are detected by a corresponding detector pixel. The phase relationship of the combined beams could be modulated by laterally translating the grating element, but a simpler, preferred method of achieving phase modulation is to scan the inspection surface under a row of microlenses which have fixed gratings, but whose gratings have different positional relationships between the grating lines and the associated microlens aperture (FIG. 3). The detector signals obtained from consecutive microlenses at a particular pair of proximate measurement points ($p_j$, $p'_j$) can be combined to effectively synthesize signals that would be obtained from a single microlens with a varying grating position.

Typically, the grating $G_j$ would be designed to extinguish the zero order, and the $+1^{st}$ and $-1^{st}$ diffracted orders would be focused to respective points $p_j$ and $p'_j$. Apertures $ap_1$, $ap_2$, $ap_3$, etc. may be used to block higher diffracted orders at the focal plane 201 (FIG. 3). In the return beam, the $+1^{st}$ diffracted order from $p_j$ and the $-1^{st}$ diffracted order from $p'_j$ are combined and directed onto a detector pixel. (Alternatively, the blocking apertures may be eliminated and more than two diffracted orders could be collected in the return beam, but in typical applications the detector signal would be dominated by the $+1^{st}$ and $-1^{st}$ orders.) The microlenses may function as components of a confocal microscope (FIG. 1) whose projection aperture (107) also functions to block higher diffracted orders in the return beam. Assuming that the higher diffracted orders are adequately filtered out in both the focused and return beams, the measured return beam intensity $I_j[z]$ from lens $L_j$, at focus position z, will have the form $$I_j[z]=I_0(|r'|^2+a[z]|r|^2+b[z]|rr'|\cos[\phi-\phi'-\Phi_j[z]]) \qquad \text{Eq 3}$$

wherein r and r' are the inspection surface's complex reflectances at points $p_j$ and $p'_j$, respectively, and $\phi$ and $\phi'$ are the respective phase angles of r and r', $$\left.\begin{array}{l} r = |r|\exp[i\phi] \\ r' = |r'|\exp[i\phi'] \end{array}\right\} \qquad \text{Eq 4}$$

(If there is a step height offset between the surface regions at $p_j$ and $p'_j$, then $\phi$ includes the phase shift due to the step height.) $\Phi_j[z]$ is a phase factor that depends on the focus position z and the lateral position of grating $G_j$; $a[z]$ and $b[z]$ are functions of z; and $I^{(0)}$ is the beam intensity that would be obtained with r=0 and r'=1. $a[z]$, $b[z]$, and $I^{(0)}$ are assumed to be the same for all microlenses. (This condition can be easily verified for $I^{(0)}$ and $a[z]$ by measuring $I_j[z]$ with a non-reflecting spot, such as a deep hole, positioned at point $p_j$ or $p'_j$. $I_j[z]$ values acquired at the spot with different microlenses, all at the same focus level z, should not differ significantly.) z is defined here as the focus height at point $p'_j$ (not $p_j$) Microlenses such as element $L_0$ that do not have associated gratings may be used to measure focus position by means of their confocal depth response. (The confocal response is maximum at z=0.)

The reflectance ratio r/r' can be determined from three intensity measurements $I_1[z]$, $I_2[z]$, and $I_3[z]$ obtained from three microlenses $L_1$, $L_2$, and $L_3$ whose associated gratings have different lateral positional offsets relative to their corresponding microlens apertures. This can be demonstrated by restating Eq 3 as follows, $$I_j[z]=I_0|r'|^2(1+a[z]|r/r'|^2+b[z]|r/r'|\cos[\phi-\phi'-\Phi_j[z]]) \qquad \text{Eq 5}$$

Three such equations for $I_1[z]$, $I_2[z]$, and $I_3[z]$ can be combined to determine the three unknown subexpressions $|r/r'|$, $(\phi-\phi')$, and $I_0|r'|^2$ in Eq 5, from which r/r' is obtained, $$r/r'=|r/r'|\exp[i(\phi-\phi')] \qquad \text{Eq 6}$$

The terms $a[z]$, $b[z]$, and $\Phi_j[z]$ in Eq 5 can be obtained by a calibration procedure in which $I_1[z]$, $I_2[z]$, and $I_3[z]$ are measured with four different r values in combination with a single r' value. There are 12 measured values, in total. One of the four r values is equal to r', so the reflectance ratio r/r' is known to be I for that case. The magnitudes and phases of the other three ratios define 6 unknowns which, together with the terms $I_0|r'|^2$, $a[z]$, $b[z]$, $\Phi_1[z]$, $\Phi_2[z]$, and $\Phi_3[z]$, constitute 12 unknowns that can be determined from the 12 measurements.

Figure 4:
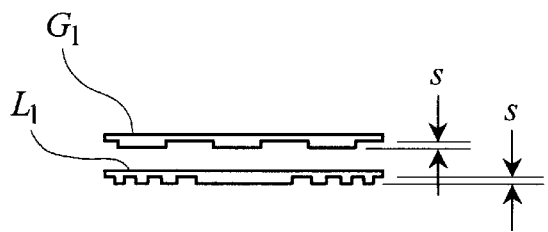
FIG. 4 shows a sectional view of two single-level, binary-optics devices - a diffraction grating and a diffractive microlens.
Figure 5:
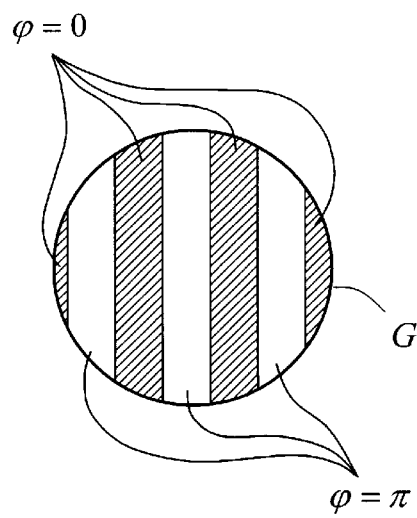
FIG. 5 shows a plan view of a binary-optic diffraction grating.
Figure 6:
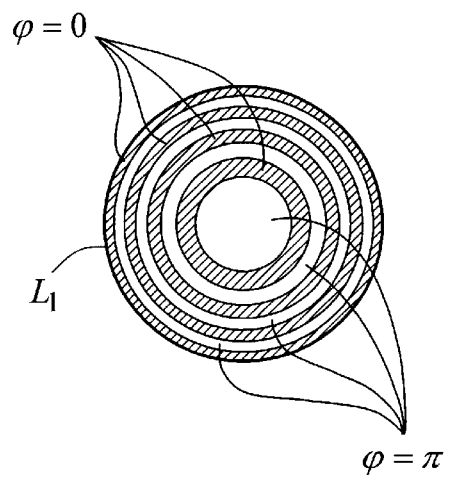
FIG. 6 shows a plan view of a binary-optic, diffractive microlens.
Figure 7:
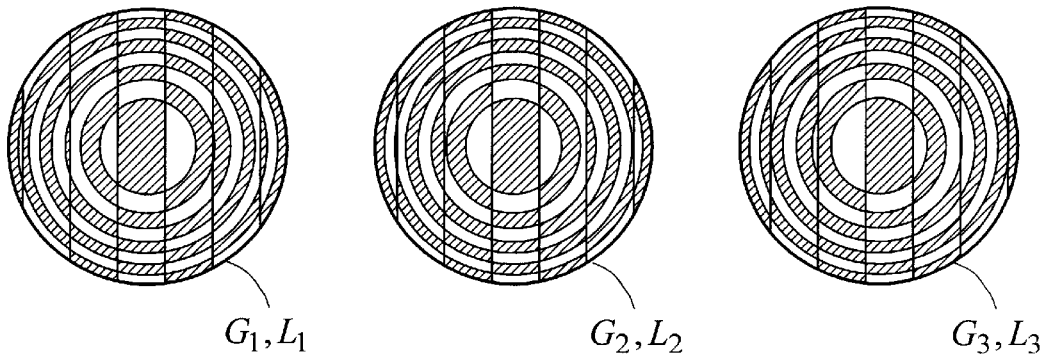
FIG. 7 shows a plan view of a binary optic element that combines the grating a lens functions.

In the FIG. 3 configuration each grating $G_j$ (j=1,2,3 . . . ) is positioned in the back focal plane of the corresponding microlens $L_j$. This has the advantage that the reflected beams from points $p_j$ and $p'_j$ will be recombined at $G_j$ without any lateral offset between the beam apertures, and thus the modulation contrast (i.e. the $b[z]$ factor in Eq 3) will be maximized. However, if the separation between $p_j$ and $p'_j$ is much smaller than the beam aperture dimension on $L_j$, the grating could be positioned much closer to the microlens without significant loss of modulation contrast, and it could even be formed directly on the microlens surface. If the microlens is a binary optic element, its design could be easily modified to include the grating finction, as illustrated in FIGS. 4–7. FIG. 4 shows a sectional view of two single-level, binary-optics devices, a diffraction grating $G_1$ and a diffractive microlens $L_1$, in close proximity to each other. The etch step height s on each element's diffractive surface is preferably selected to provide a relative phase shift of $\pi$ between portions of the beam transmitting through the two surface levels, $$s = \frac{\lambda}{2|n_1 - n_2|} \qquad \text{Eq 7}$$

wherein λ is the operating wavelength, and $n_1$ and $n_2$ are the refractive indices on either side of the diffracting surface. Plan views of $G_1$ and $L_1$, showing the relative phase shift φ induced by the different surface levels, are illustrated in FIGS. 5 and 6. A single element combining both the grating and lens functions can be designed by adding the two phase functions modulo 2π. Each phase function has two levels, 0 and π (indicated in the figures by shaded and unshaded regions, respectively), so the sum would comprise three levels, 0, π, and 2π. However, the 2π phase shift can be replaced by a zero phase shift, so the modulo-2π sum will just comprise two phase levels, 0 and π. The composite element, denoted "$G_1, L_1$", is illustrated in FIG. 7. Also, FIG. 7 illustrates two similar elements, "$G_2, L_2$" and "$G_3, L_3$", each of which has a different lateral positional relationships between the grating lines and the associated microlens aperture. This design approach can also be applied to more general N-level binary optic designs. The phase levels in an N-level design are generally 0, 2π/N, 4π/N, ... 2π(N−1)/N; and adding two such phase functions modulo-2π results in a composite phase function which also has the same N phase levels.

The invention can use a variety of microlens forms. The microlenses could comprise continuous-profile, grayscale-etched or molded refracting surfaces; or they could comprise Fresnel lenses, binary-optic diffractive lenses, or focusing elements of other types. In addition, the microlens elements could be provided with individual, MEMS-actuated focus controls as described in Provisional App. No. 60/115,451, and each microlens could also comprise two lens elements in series, in the configuration described in Provisional App. No. 60/119,403. (Similar variations are described in U.S. pat. application Ser. No. 09/481,379.) In the context of this disclosure the term "microlens" can optionally be construed as a compound lens comprising two or more lens elements, and "microlens array" can be construed as a multi-stage microlens array comprising two or more stages.

What is claimed is:

1. An imaging system comprising an illumination source, an optical projection system, a microlens array, a detector pixel array, and a scanning mechanism, wherein the microlens array comprises a plurality of microlenses and corresponding beam-splitting mechanisms;

each microlens and its corresponding beam-splitting mechanism operate conjunctively to separate incident illumination from the illumination source into at least two beams, at least one of which is focused onto and reflects off an inspection sample surface, and the microlens and beam-splitting mechanism also operate to recombine at least two of the separated beams (including at least one sample-reflected beam);

the projection system projects the recombined beams from each microlens onto a corresponding pixel element in the pixel array;

the recombined beams from each microlens have an optical phase relationship that depends on the sample's reflectance properties and surface height;

each detector pixel generates a detector signal that is sensitive to the phase relationship between the recombined beams that are projected onto the pixel; and the scanning mechanism establishes relative motion between the microlens array and the inspection sample as the detector signals are acquired, whereby each detector pixel signal is acquired over a range of scan positions.

2. The imaging system of claim 1 wherein each beam-splitting mechanism comprises a partially-reflective beam-splitter film between the corresponding microlens and the sample, and further comprises a reference mirror proximate to the microlens;

incident illumination is focused by each microlens and is separated by means of partial reflection at the beam-splitter film into first and second separated beams, whereby the first beam is focused onto the sample and the second beam is focused onto the reference mirror; and the first separated beam from each beam-splitter film reflects off the sample, the second beam reflects off the reference mirror, and the beam-splitter recombines the two reflected beams by means of partial reflection into a combined pair of beams that transmits back through the corresponding microlens and is projected onto the corresponding detector pixel.

3. The imaging system of claim 1 wherein each beam-splitting mechanism comprises a diffraction grating formed on or proximate to the corresponding microlens; and the diffracting action of each diffraction grating, and the focusing action of each microlens, operate conjunctively to separate incident illumination into at least two focused beams that are directed onto and reflect off the sample; and at least two of the focused beams from each microlens are recombined by the microlens and associated diffraction grating and are projected onto the corresponding detector pixel.

4. The imaging system of claim 3 wherein each diffraction grating and corresponding microlens comprise a common binary-optic element that is configured to perform both the focusing and beam-separation functions.

5. The imaging system of claim 1 wherein detector signals are sequentially acquired with the sample in multiple positions relative to the microlens array so that the detector signal from a typical sample point is sequentially acquired from multiple microlenses and associated beam-splitting mechanisms, and wherein the multiple microlenses and associated beam-splitting mechanisms are configured to produce different phase relationships between their corresponding recombined beams; whereby the signals' phase sensitivity is enhanced.

6. The imaging system of claim 2 wherein detector signals are sequentially acquired with the sample in multiple positions relative to the microlens array so that the detector signal from a typical sample point is sequentially acquired from multiple microlenses and associated beam-splitter films and reference mirrors, and wherein the separation distances between each of the multiple microlenses and its associated beam-splitter film and reference mirror are configured to produce different phase relationships between the corresponding recombined beams; whereby the signals' phase sensitivity is enhanced.

7. The imaging system of claim 3 wherein detector signals are sequentially acquired with the sample in multiple positions relative to the microlens array so that the detector signal from a typical sample point is sequentially acquired from multiple microlenses and associated diffraction gratings, and wherein the lateral positional relationship between each of the multiple gratings' grating lines and its associated microlens aperture are configured to produce different phase relationships between the corresponding recombined beams; whereby the signals' phase sensitivity is enhanced.

* * * * *

UNITED STATES PATENT AND TRADEMARK OFFICE
CERTIFICATE OF CORRECTION

PATENT NO.    : 6,392,752 B1
DATED         : May 21, 2002
INVENTOR(S)   : Kenneth Carlisle Johnson It is certified that error appears in the above-identified patent and that said Letters Patent is hereby corrected as shown below:

Column 3,
Line 5, change "combine" to -- combined to --.

Column 6,
Equation 3, change "$I_0$" to -- $I^{(0)}$ --.
Equation 5, change "$I_0$" to -- $I^{(0)}$ --.
Line 36, change "$I_0$" to -- $I^{(0)}$ --.
Line 46, change "$I_0$" to -- $I^{(0)}$ --.

Signed and Sealed this

Twenty-second Day of July, 2003

JAMES E. ROGAN
*Director of the United States Patent and Trademark Office*